United States Patent
Fujiwara et al.

(10) Patent No.: US 6,603,359 B2
(45) Date of Patent: Aug. 5, 2003

(54) HIGH-FREQUENCY POWER AMPLIFYING APPARATUS

(75) Inventors: Yukinari Fujiwara, Tokyo (JP); Yoshitaka Shinomiya, Tokyo (JP)

(73) Assignee: Mobile Communications Tokyo Inc., Tokyo (JP)

( * ) Notice: Subject to any disclaimer, the term of this patent is extended or adjusted under 35 U.S.C. 154(b) by 0 days.

(21) Appl. No.: 10/105,593

(22) Filed: Mar. 25, 2002

(65) Prior Publication Data

US 2002/0140503 A1 Oct. 3, 2002

(30) Foreign Application Priority Data

Mar. 27, 2001 (JP) ........................................ 2001-090198

(51) Int. Cl.[7] .............................. H03F 3/04; H03F 3/68
(52) U.S. Cl. ........................ 330/310; 330/51; 330/302; 330/280
(58) Field of Search ..................... 333/1.1, 161; 330/51, 330/280, 302, 310

(56) References Cited

U.S. PATENT DOCUMENTS 5,661,434 A * 8/1997 Brozovich .................. 330/51
6,060,949 A * 5/2000 Kaufman et al. ............. 330/51
6,144,255 A * 11/2000 Patel et al. ................. 330/151
2002/0140503 A1 * 10/2002 Fujiwara et al. ............. 330/51

FOREIGN PATENT DOCUMENTS

JP 2002237727 * 8/2002

OTHER PUBLICATIONS

Chen IEEE Journal of Solid–State Circuits vol. 3 Issue 3 Jun. 1968 pp 165–179.*

* cited by examiner

*Primary Examiner*—Michael B Shingleton
(74) *Attorney, Agent, or Firm*—Frishauf, Holtz, Goodman & Chick, P.C.

(57) ABSTRACT

A high-frequency power amplifying apparatus includes a plurality of series-connected amplifiers, a power controller for selectively supplying an output terminal with an output from a desired one amplifier in accordance with a demanded output power and for causing one or more amplifiers downstream of the desired one amplifier to be in a cutoff state, and an output delay line connected between the output terminal and the final-stage amplifier and having a line length thereof providing the final-stage amplifier with a high impedance as viewed from the output terminal when the final-stage amplifier is in a cutoff state.

14 Claims, 4 Drawing Sheets

HIGH-FREQUENCY POWER AMPLIFYING APPARATUS

BACKGROUND OF THE INVENTION

1. Technical Field

The present invention relates to a high-frequency power amplifying apparatus including a plurality of series-connected amplifiers, and more particularly, to a high-frequency power amplifying apparatus for delivering, with a reduced loss, the output of that one of the series-connected amplifiers which is selected in accordance with the demanded output power, thereby attaining a high power efficiency.

2. Related Art

The transmission output of a cellular phone is not required to be always maintained at its maximum level, and may be decreased if the distance between the cellular phone and a base station for the other end of the phone line is short. In general circumstances, the cellular phone is operable with stability at a transmission output level which is one-tenth of the maximum level. By decreasing the transmission output in this manner, waste power consumption can be prevented and the best possible use of capacity of a power source secondary battery of the cellular phone can be achieved, to thereby permit the cellular phone to operate for a long time.

To variably control the output of a high-frequency power amplifying apparatus comprised of series-connected amplifiers, one of these amplifiers is selected in accordance with the demanded output power, and the output of the selected amplifier is supplied to the output terminal of the power amplifying apparatus, as described in Japanese provisional patent publication no. 4-260209. Thus, a high-frequency input signal to the power amplifying apparatus is amplified by one or more amplifiers arranged on the upstream side (i.e., pre-stage side) of the selected amplifier and then amplified by the selected amplifier. The resultant amplified signal is delivered from the power amplifying apparatus, bypassing one or more amplifiers arranged on the downstream side (i.e., post-stage side) of the selected amplifier. When the first-stage amplifier is selected so that there is no upstream amplifier for the selected amplifier, the input signal amplified by the first-stage amplifier is delivered from the power amplifying apparatus, bypassing the second- to final-stage amplifiers. When the final-stage amplifier is selected so that there is no downstream amplifier for the selected amplifier, the input signal amplified by the first- to final-stage amplifiers is delivered from the power amplifying apparatus.

As shown by way of example in FIG. 4, the high-frequency power amplifying apparatus of this type is comprised of first- and second-stage amplifiers 1 and 2 connected in series with each other, and a switch circuit 3 controlled by a control circuit 5. The switch circuit 3 is arranged between the output terminal of the first-stage amplifier 1, the input terminal of the second-stage amplifier, and a bypass circuit that is provided with a half-wavelength delay line ($\lambda g/2$ line) 4 and connected to the output terminal 6b of the power amplifying apparatus. Reference numeral 6a denotes the input terminal of the power amplifying apparatus; 7a, a matching circuit disposed between the first-stage amplifier 1 and the switch circuit 3; and 7b, a matching circuit disposed between the second-stage amplifier 2 and the output terminal 6b.

When a high output power is demanded, the switch circuit 3 is switched to the second-stage amplifier 2, so that the output of the first-stage amplifier 1 may be amplified by the second-stage amplifier 2 to obtain a high output. When a low output power is requested, the switch circuit 3 is switched to the bypass circuit, so that the output of the first-stage amplifier 1 may be delivered as a low output from the power amplifying apparatus, bypassing the second-stage amplifier 2.

With this power amplifying apparatus, a high output can be taken from the second-stage amplifier 2 without problems, because a resistance for input signal at the bypass-circuit contact 3a becomes large when the switch circuit 3 is connected to the second-stage amplifier 2 to open the contact 3a and because the half-wavelength delay line 4 is provided in the bypass circuit.

When the switch circuit 3 is connected to the bypass circuit to obtain a low output power, however, the output impedance of the second-stage amplifier 2, as viewed from the output terminal 6b, has a value which is not negligible with respect to a load (not shown) such as an antenna since the second-stage amplifier 2 is connected to the output terminal 6b of the power amplifying apparatus. For this reason, when the switch circuit 3 is connected to the bypass circuit, the second-stage amplifier 2 serves as a load for the first-stage amplifier 1, causing an increased loss.

Another type of high-frequency power amplifying apparatus is disclosed in Japanese provisional patent publication no. 2000-165164. As shown in FIG. 5, this power amplifying apparatus comprises a directional coupler 8 for receiving outputs of first- and second-stage amplifiers 1 and 2 and a terminal switch 9 controlled by a control circuit 5, so that the isolation terminal 8a of the directional coupler 8 may be terminated with a predetermined impedance 9a or may be opened or short-circuited by means of the terminal switch 9, thereby varying the terminal impedance of the directional coupler 8.

With this power amplifying apparatus, a loss in the directional coupler 5 can be decreased to some extent by causing the isolation terminal 8a of the directional coupler 8 to be opened or short-circuited when the switch circuit 3 is connected to the second-stage amplifier 2 to obtain a high output.

However, such an arrangement entails upsizing of the power amplifying apparatus since it includes the directional coupler 8, and entails an increased loss especially when it delivers a low output since the directional coupler 8 is provided through which the output of each amplifier 1 or 2 is supplied to the output terminal 6b.

SUMMARY OF THE INVENTION

An object of the present invention is to provide a high-frequency power amplifying apparatus which is simple in construction and which is capable of generating a variable output at a high power efficiency by supplying the output of the desired one of a plurality of series-connected amplifiers, with a reduced loss, to the output terminal of the amplifying apparatus.

A high-frequency power amplifying apparatus according to the present invention comprises: a plurality of amplifiers including at least first- and final-stage amplifiers and connected in series with one another in increasing order of saturation power; an input terminal connected to the first-stage amplifier; an output terminal connected to the final-stage amplifier; a power controller for selectively supplying the output terminal with an output from a desired one of the plurality of amplifiers in accordance with an externally demanded output power and for causing one or more amplifiers downstream of the desired one amplifier to be in a cutoff state when the desired one amplifier is not the final-stage amplifier; and an output delay line connected between the output terminal and the final-stage amplifier and having a line length thereof providing the final-stage amplifier with a high impedance as viewed from the output terminal when the final-stage amplifier is in a cutoff state.

According to the present invention, it is unnecessary to provide a directional coupler between the plurality of amplifiers and the output terminal of the power amplifying apparatus, and accordingly a loss is eliminated which is caused by the directional coupler. Thus, the power efficiency of the power amplifying apparatus can be improved and the power amplifying apparatus can be simplified in construction. In addition, when the output of an arbitrary amplifier disposed upstream of the final-stage amplifier is selectively supplied to the output terminal of the apparatus, the high-impedance output delay line prevents one or more amplifiers, if any, disposed downstream of the arbitrary amplifier from constituting a substantial load for the first-stage amplifier through the arbitrary amplifier. This makes it possible to supply the output of the arbitrary amplifier to the output terminal of the power amplifying apparatus without causing a substantial loss, bypassing the one or more downstream amplifiers, thereby permitting the power amplifying apparatus to deliver a variable output at a high power efficiency. In particular, the power efficiency at the time of delivering a low or medium power output can be improved.

In the present invention, preferably, the power amplifying apparatus further comprises one or more switch circuits each interposed between the output terminal of the power amplifying apparatus and corresponding two adjacent amplifiers among the plurality of amplifiers. The power controller closes a desired one of the one or more switch circuits in accordance with the demanded output power.

With this preferred arrangement, by closing a desired one switch circuit, the output of a desired one amplifier can be selectively supplied to the output terminal of the power amplifying apparatus.

Preferably, the power amplifying apparatus further comprises one or more bias switches individually interposed between bias voltage sources and the plurality of amplifiers other than the first-stage amplifier. The power controller opens at least one bias switch corresponding to one or more amplifiers disposed downstream of the desired one amplifier when the desired one amplifier is not the final-stage amplifier.

With this preferred arrangement, a cutoff state can be attained for one or more amplifiers downstream of a desired one amplifier by opening at least one bias switch.

Preferably, the line length of the output delay line is set to a length that provides the final-stage amplifier with a high pure resistance as viewed from the output terminal of the power amplifying apparatus when the final-stage amplifier is in a cutoff state.

According to this preferred arrangement, when the output of the arbitrary amplifier is supplied to the output terminal of the power amplifying apparatus, one or more amplifiers downstream of the arbitrary amplifier can be positively prevented from constituting a load for the first-stage amplifier through the arbitrary amplifier, whereby the power efficiency can be improved.

Preferably, each of the one or more switch circuits has a first on-off contact whose one side is connected between two amplifiers associated therewith, a second on-off contact interposed between another side of the first on-off contact and the output terminal of the power amplifying apparatus, and a third on-off contact whose one side is connected between the first and second on-off contacts and another side thereof is grounded. Under the control of the power controller, the third on-off contact is closed when the first and second on-off contacts are open and is opened when the first and second on-off contacts are closed.

With this preferred arrangement, when the first and second on-off contacts are open, the degree of isolation therebetween can be made sufficiently high enough to prevent leakage of a high-frequency signal through the first and second contacts between each amplifier and the terminal output of the amplifying apparatus, thereby reducing a loss and making each switch circuit compact in size.

Preferably, the power amplifying apparatus further comprises a plurality of output matching circuits that are connected individually to output sides of the plurality of amplifiers and serve to increase output impedances of the plurality of amplifiers. More preferably, each output matching circuit increases the output impedance of a corresponding one amplifier in the order of approximately 200 ohms.

With this preferred arrangement, it is possible to reduce a loss caused by an on-resistance observed when a switch circuit corresponding to a desired one of the plurality of amplifiers is closed so as to supply the output of the desired one amplifier to the output terminal of the power amplifying apparatus.

Preferably, the power amplifying apparatus further comprises an impedance conversion circuit connected between the one or more switch circuits, the output delay line and the output terminal of the power amplifying apparatus and serves to match the output from each of the plurality of amplifiers to an output-terminal impedance of the power amplifying apparatus. For instance, the output-terminal impedance of the power amplifying apparatus is set at 50 ohms.

With the preferred arrangement, the power amplifying apparatus is enabled to supply its output power to a load such as an antenna with a reduced loss and at a high power efficiency.

Preferably, the power amplifying apparatus further comprises one or more first bypass delay lines each of which is $1/4$ wavelength long and is interposed between a corresponding one of the plurality of amplifiers and the switch circuit associated therewith.

In this preferred arrangement, bypass circuits are formed, which individually permit outputs of one or more amplifiers other than the final-stage amplifier to be supplied to the output terminal of the power amplifying apparatus. When the output of an arbitrary one amplifier is supplied to the output terminal, the switch circuit of at least one bypass circuit corresponding to the remaining one or more amplifiers is opened to disconnect the at least one bypass circuit from the amplifier associated therewith. Since each bypass circuit is provided with the first bypass delay line, the bypass circuit disconnected from the amplifier associated therewith has high impedance, so that a loss in the bypass circuit may be reduced. The influence of the on-resistance of each switch circuit, observed when the switch circuit is closed, onto the supply of the amplifier output to the output terminal of the power amplifying apparatus can be reduced, so that each switch circuit entails a reduced loss.

More preferably, each of the one or more switch circuits has a first on-off contact interposed between the amplifier associated therewith and the output terminal of the power amplifying apparatus, a second on-off contact interposed between the associated amplifier and a grounding. Under the control of the power controller, the second on-off contact is closed when the first on-off contact is open and is opened when the first on-off contact is closed.

With this preferred arrangement, the degree of isolation between the amplifier and the output terminal of the power amplifying apparatus observed when the first on-off contact is open is increased, so that a loss caused by leakage of a high-frequency signal between the amplifier and the output terminal may be decreased.

Preferably, the power amplifying apparatus provided with one or more first bypass delay lines each of which is ¼ wavelength long, further comprises a second bypass delay line which is interposed between the output terminal of the power amplifying apparatus and the one or more switch circuits and which is ¼ wavelength long.

In this preferred arrangement, each of bypass circuits for permitting amplifier outputs to be supplied to the output terminal of the power amplifying apparatus includes the first and second bypass delay lines. With this arrangement, when each bypass circuit is disconnected from the amplifier associated therewith, the impedance of the bypass circuit as viewed from the amplifier and the impedance of the bypass circuit as viewed from the output terminal of the power amplifying apparatus have sufficiently increased values. This makes it possible to suppress the influence of each bypass circuit onto the transmission of a high-frequency signal from the amplifier immediately upstream of the bypass circuit to the amplifier immediately downstream thereof and onto the signal output from the final-stage amplifier. Thus, a high-frequency signal can be amplified by the first- to final-stage amplifiers with a reduced loss and can be taken from the final-stage amplifier. When the output from a desired one amplifier is supplied through the associated bypass circuit to the output terminal of the power amplifying apparatus, the first and second bypass delay lines of the bypass circuit constitute, as a whole, a delay line which is ½ wavelength long, so that the amplifier output may be supplied to the output terminal of the power amplifying apparatus with a reduced loss.

Preferably, each switch circuit has a first on-off contact interposed between the first and second bypass delay lines, a second on-off contact interposed between a grounding and a connection between the first bypass delay line and the first on-off contact, and a third on-off contact interposed between a grounding and a connection between the first on-off contact and the second bypass delay line. Under the control of the power controller, the second and third on-off contacts are closed when the first on-off contact is open and are opened when the first on-off contact is closed.

With this preferred arrangement, when the first on-off contact of each switch circuit is opened, the first bypass delay line has a sufficiently high impedance as viewed from the amplifier corresponding to the switch circuit and the second bypass delay line has a sufficiently high impedance as viewed from the output terminal of the power amplifying apparatus. Thus, the bypass circuit disconnected from the associated amplifier can have a high impedance, whereby a loss attributable to the bypass circuit can be decreased.

Preferably, the power amplifying apparatus further comprises a plurality of input matching circuits each connected to an input side of a corresponding one of the plurality of amplifiers. Each input matching circuit performs impedance-matching of a high-frequency signal, supplied from the input terminal of the power amplifying apparatus or the amplifier immediately upstream of the input matching circuit, to the amplifier immediately downstream of the input matching circuit.

With this preferred arrangement, a high-frequency signal can be transmitted between adjacent two amplifiers with a reduced loss.

More preferably, the power amplifying apparatus further comprises a plurality of input delay lines. Each input delay line is interposed between the input matching circuit associated therewith and the amplifier immediately upstream of the input matching circuit, and serves to increase the impedance of a downstream amplifier as viewed from an upstream amplifier when the switch circuit is open, which is connected at its one side between the upstream amplifier and the downstream amplifier. The upstream amplifier is disposed immediately upstream of the input delay line, and the downstream amplifier is disposed immediately downstream of the upstream amplifier.

According to this preferred arrangement, when a switch circuit is open and the amplifier downstream of the switch circuit is in a cutoff state, the interference between the amplifiers disposed upstream and downstream of the switch circuit can be effectively prevented.

The power amplifying apparatus provided with the plurality of amplifiers constituted by the first- and final-stage amplifiers may comprise a circulator interposed between the output delay line and the output terminal of the power amplifying apparatus. The circulator has a first terminal for receiving an output of the first-stage amplifier through the switch circuit associated therewith, a second terminal for receiving an output of the final-stage amplifier through the output delay line, and a third terminal connected to the output terminal of the power amplifying apparatus, and is configured to transmit a signal received at the first terminal to the second terminal and then transmit the same to the third terminal, and transmit a signal received at the second terminal to the third terminal, thereby supplying the output from the first-stage or final-stage amplifier to the output terminal of the power amplifying apparatus.

With this preferred arrangement, the output of the final-stage amplifier can be supplied through the second and third terminals of the circulator to the output terminal of the power amplifying apparatus with a reduced loss without causing leakage of the output of the final-stage amplifier to the first-stage amplifier. Since the output delay line is interposed between the circulator and the final-stage amplifier and hence the final-stage amplifier has a sufficiently high impedance as viewed from the output terminal of the power amplifying apparatus, the output from the first-stage amplifier can be supplied to the output terminal of the power amplifying apparatus with a reduced loss.

DETAILED DESCRIPTION

A high-frequency power amplifying apparatus according to a first embodiment of the present invention will be explained.

The power amplifying apparatus of this embodiment is mounted to a transmitter section of a cellular phone, for instance, and is configured, in this case, to generate a variable output in accordance with the demanded output power and supply the variable output to an antenna serving as a load.

Figure 1:
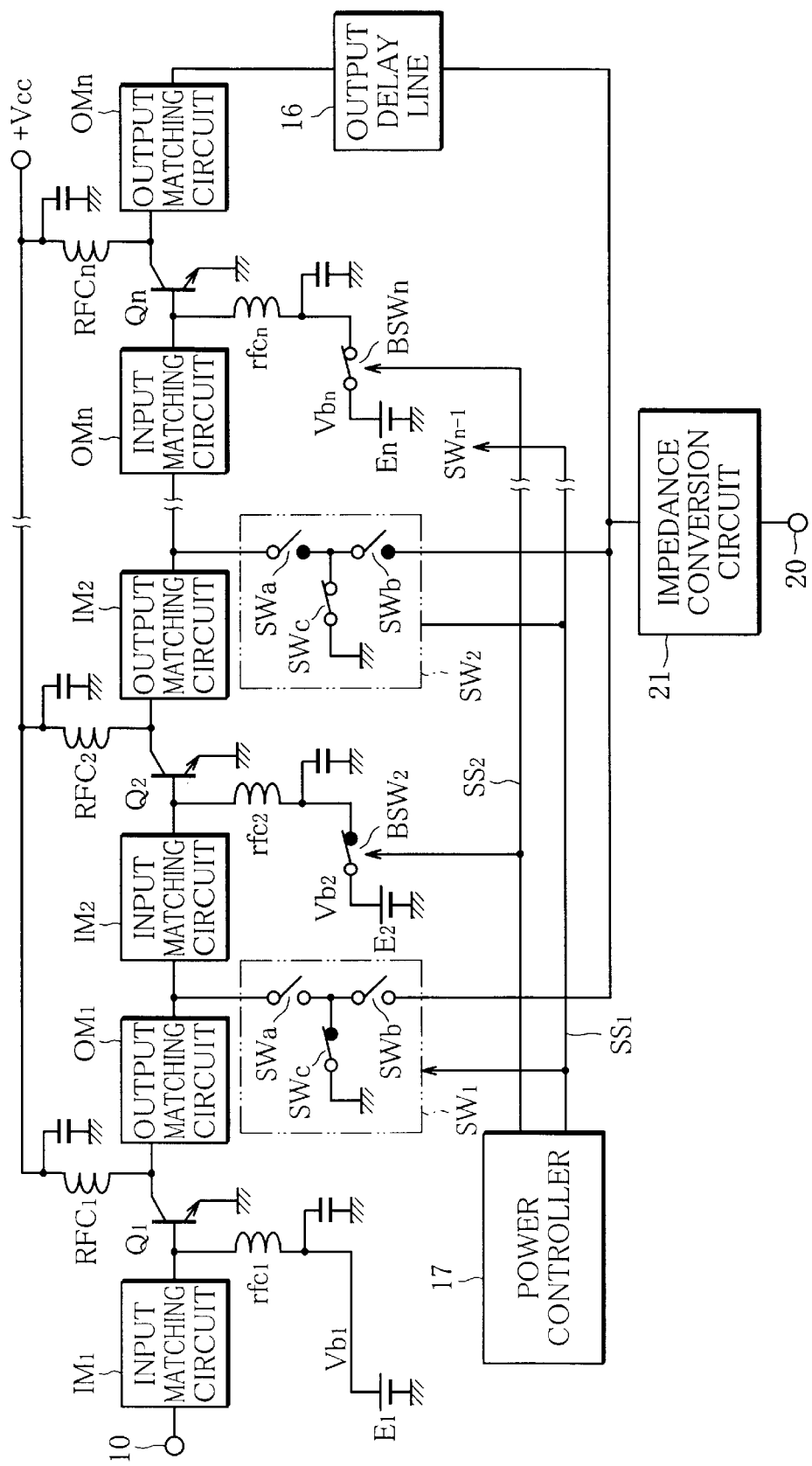
FIG. 1 is a schematic block diagram showing a high-frequency power amplifier according to a first embodiment of the present invention.

The power amplifying apparatus comprises a multi-stage amplifier comprised of a plurality of amplifiers, e.g., n amplifiers, which are series-connected with one another in the order of saturation power. The first-stage amplifier through the n'th-stage amplifier are each constituted by a transistor for high-frequency power amplification such as a hetero-junction bipolar transistor (HBT), which is formed on a GaAs compound semiconductor, for instance. In FIG. 1, the first-stage amplifier, the second-stage amplifier and the n'th-stage amplifier serving as the final-stage amplifier are shown by symbols Q1, Q2 and Qn, respectively, whereas the illustration of the third- through (n−1)'th-stage amplifiers is omitted. The amplifiers Q1–Qn have their emitters grounded, collectors thereof connected to a power source Vcc through choke coils RFC1–FRCn, and bases thereof supplied with bias voltages Vb1–Vbn from bias voltage sources E1–En through bias elements rfc1–rfcn, respectively.

The amplifiers Q1–Qn are provided at their input side with input matching circuits IM1–IMn each of which serves to match a high-frequency signal, supplied from the input terminal 10 of the power amplifying apparatus or from the amplifier disposed immediately upstream thereof, to the associated amplifier. The amplifiers Q1–Qn are provided at their output side with output matching circuits OM1–OMn for increasing the output impedances of these amplifiers in the order of approximately 200 ohms, for instance. Each amplifier is configured to amplify, with a predetermined gain, an input signal supplied through the input matching circuit, and to output the amplified signal through the output matching circuit.

In order to vary the output in accordance with the demanded output power from, e.g., a base station, the power amplifying apparatus is provided with first to (n−1)'th switch circuits (only the first and second switch circuits SW1, SW2 are shown) each interposed between corresponding two adjacent amplifiers Q1, Q2; - - - ; or Qn−1, Qn and the output terminal 20, and a power controller 17 for opening all the n−1 switch circuits or selectively closing the desired one switch circuit in accordance with the demanded output power.

More specifically, the first switch circuit SW1 has first to third on-off contacts SWa–SWc. The first contact SWa has one side thereof connected between the output matching circuit OM1 immediately upstream of the first contact SWa and the input matching circuit IM2 immediately downstream of the first contact, and has another side thereof connected to one side of the second contact SWb. Another side of the second contact SWb is connected to the output terminal of the amplifying apparatus through an impedance conversion circuit 21. The third contact SWc has one side thereof connected between the first and second contacts SWa, SWb and another side thereof grounded. Under the control of the power controller 17, the third contact SWc is closed when the first and second contacts SWa, SWb are open and is opened when the contacts SWa, SWb are closed. Similarly, each of the second to (n−1)'th switch circuits is comprised of first to third contacts SWa–SWc.

With the thus configured switch circuit, when the first and second contacts SWa, SWb are open, they are grounded through the third contact SWc, so that the degree of isolation between them may sufficiently increase to prevent leakage of a signal therebetween, thereby reducing a loss. In addition, the switch circuit can be made compact in size.

When all the switch circuits are open, the output of the final-stage amplifier Qn is supplied to the output terminal 20 through the output matching circuit OMn, the output delay line 16 and the impedance conversion circuit 21. On the other hand, when a switch circuit is supplied with a switch selection output SS1 from the power controller 17, the first and second contact SWa, SWb of the switch circuit are closed and the third contact SWc thereof is opened, so that the output from the amplifier immediately upstream of the switch circuit is supplied to the output terminal 20 through the impedance conversion circuit 21, bypassing one or more amplifiers downstream of the upstream amplifier.

The impedance conversion circuit 21 serves to achieve matching of the output from each amplifier having a high impedance to the output-terminal impedance of the power amplifying apparatus, thereby supplying the amplifier output to the output terminal 20 with a reduced loss. For instance, the output-terminal impedance is set to approximately 50 ohms so as to correspond to the load impedance of the power amplifying apparatus such as the impedance of an antenna.

In connection with the second- to n'th-stage amplifiers Q2–Qn, the power amplifying apparatus comprises bias switches BSW2–BSWn interposed between the bias elements rfc2–frcn and a grounding, respectively. These bias switches are controlled by the power controller 17 to be opened or closed, respectively.

As mentioned previously, the power controller 17 opens all the switch circuits or selectively closes the desired one switch circuit to vary the output of the power amplifying apparatus. At this time, the power controller 17 also applies a bias switch selection output SS2 to one or more bias switches corresponding to one or more amplifiers disposed downstream of the downstream amplifier among adjacent two amplifiers associated with the selectively closed switch circuit. As a result, the one or more bias switches are opened, so that the corresponding one or more amplifiers are brought in a cutoff state, with their bases grounded, whereby useless power consumption can be suppressed.

As explained in the above, the output delay line 16 is interposed between the final-stage amplifier Qn and the impedance conversion circuit 21. The output delay line 16 is constituted by a distributed constant type delay line or a constant concentrated type delay line. The line length of the output delay line 16 is set to a value such as to permit the output delay line 16 to serve as a high-impedance pure resistance as viewed from the output terminal 20, when the bias switch BSn is open to prevent the bias voltage Vbn from being applied to the final-stage amplifier Qn so as to cause the amplifier Qn to be cutoff. By connecting the output matching circuit OMn for the final-stage amplifier Qn through such an output delay line 16 to the output terminal 20, the final-stage amplifier Qn which is in a cutoff state is prevented from acting as a load for the upstream amplifiers, whereby a loss is greatly decreased.

According to the thus constructed power amplifying apparatus, the series-connected amplifiers Q1–Qn have high output impedances since they are provided with the output matching circuits OM1–OMn. Accordingly, when an arbitrary switch circuit is closed to take the output from the associated amplifier to generate a low output power, the on-resistance of the switch circuit does not cause a substantial loss. Although each amplifier has a high impedance, the amplifier output can be supplied to a load such as an antenna at a high power efficiency without causing a loss, since the amplifier output is subject to impedance conversion by the impedance conversion circuit 21 before supplied to the output terminal 20.

When the final-stage amplifier Qn is in a conduction state, the output delay line 16 acts as a delay line that matches the output matching circuit OMn, and accordingly the output can be taken with a reduced loss from the final-stage amplifier Qn and then supplied to the output terminal 20. On the other hand, when the final-stage amplifier Qn is in a cutoff state, the output delay line 16 serves as a high impedance pure resistance to one or more amplifiers upstream of the final-stage amplifier Qn, and accordingly the final-stage amplifier Qn does not act as a load for the one or more upstream amplifiers. This makes it possible to selectively take the output from the desired one upstream amplifier at a reduced loss.

In the following, a high-frequency power amplifying apparatus according to a second embodiment of this invention will be explained with reference to FIG. 2.

The power amplifying apparatus of this embodiment has the basic arrangement which is similar to that of the first embodiment. That is, the power amplifying apparatus comprises the first-stage amplifier Q1 and the second-stage amplifier (final-stage amplifier) Q2 which are connected in series with each other. Transistors that constitute the amplifiers Q1, Q2 have their emitters that are grounded, collectors thereof connected to a power source Vcc through choke coils RFC1, RFC2, and bases thereof for receiving bias voltages Vb1, Vb2 through bias elements rfc1, rfc2, respectively. A bias switch BSW2 is interposed between the bias element rfc2 and a grounding. The amplifiers Q1, Q2 are provided at their input side with input matching circuits IM1, IM2 and at their output side with output matching circuit OM1, OM2. An output delay line 16 is interposed between the output matching circuit OM2 and an output terminal 20. The power amplifying apparatus is configured to close or open a switch circuit SW1 by means of a power controller 17 in accordance with the demanded output power, so as to selectively supply the output terminal 20 with the output from the amplifier Q1 or Q2.

As mentioned above, the power amplifying apparatus of this embodiment is similar to the first embodiment in basic arrangement and operation, but is different therefrom mainly in the construction of the bypass circuit. In addition, it differs from the first embodiment in that the impedance conversion circuit 21 shown in FIG. 1 is omitted and a bias current varying circuit 24 and a delay line 25 are provided, and the switch circuit SW1 has a different construction.

In the following, these differences are mainly explained.

The bypass circuit is provided with a first bypass delay line 22 having a line length of ¼ wavelength and having one end thereof connected to the output terminal of the first-stage amplifier Q1, and a second bypass delay line 23 having a line length of ¼ wavelength and having one end thereof connected to the output terminal 20, in addition to the switch circuit SW1.

The switch circuit SW1 has a first on-off contact SWd interposed between the bypass delay lines 22, 23, a second on-off contact SWe interposed between the grounding line and the connection between one side of the first contact SWd and the first bypass delay line 22, and a third on-off contact SWf interposed between the grounding line and the connection between another side of the first contact SWd and the second delay line 23. When the first contact SWd is opened and the second and third contacts SWe, SWf are closed under the control of the power controller 17, the bypass delay lines 22, 23 are short-circuited to the grounding line, thereby sufficiently increasing the impedance of the first bypass delay line 22 as viewed from the output terminal of the first-stage amplifier Q1 and the impedance of the second bypass delay line 23 as viewed from the output terminal 20.

Accordingly, the impedance of the bypass circuit as viewed from the first-stage amplifier Q1 and the impedance of the bypass circuit as viewed from the output terminal 20 are sufficiently high when a high power output is taken from the second-stage amplifier Q2. As a result, a high-frequency signal can be transmitted from the first-stage amplifier Q1 to the second-stage amplifier Q2 without causing a substantial loss. The bypass circuit acts as having a high impedance for the second-stage amplifier Q2, and hence does not affect on a load for the second-stage amplifier Q2. This makes it possible to take a signal output from the second-stage amplifier Q2 with no substantial loss.

When a low power output is taken from the first-stage amplifier Q1, the first bypass delay line 22 cooperates with the second bypass delay line 23 to form a delay line of ½ wavelength long, whereby a high-frequency signal can be transmitted to the output terminal 20 without causing a signal transmission loss. In combination with the function achieved by the output delay line 16 inserted between the output terminal of the second-stage amplifier Q2 and the output terminal 20, this makes it possible to achieve the power output entailing no substantial loss.

For the simplicity of the circuit arrangement, the second bypass delay line 23 may be omitted. In this case, the switch circuit SW1 should be constituted by a first on-off contact interposed between the first bypass delay line 22 and the output terminal 20, and a second on-off contact adapted to be closed under the control of the power controller 17 to cause the first bypass delay line 22 to be short-circuited to a grounding line when the first on-off contact is open, so as not to permit the output terminal 20 to be short-circuited to the grounding line.

The bypass-current varying circuit 24 serves to vary the bias voltage Vb1 for the first-stage amplifier Q1, thereby variably setting the power efficiency and gain of the first-stage amplifier Q1. This arrangement makes it possible to precisely carry out the variable setting of the output power and power efficiency of the power amplifying apparatus, in addition to perform the two-stepwise switching of the output power thereof by selectively applying the output from the first or second-stage amplifier Q1 or Q2 to the output terminal 20.

The delay line 25 provided on the input side of the second-stage amplifier Q2 serves to cause the second-stage amplifier Q2 to have a sufficiently high impedance as viewed from the first-stage amplifier Q1, thereby eliminating the influence of making the second-stage amplifier Q2 cutoff onto the first-stage amplifier Q1, so that the interference between the amplifiers Q1 and Q2 may be effectively prevented with ease.

Figure 3:
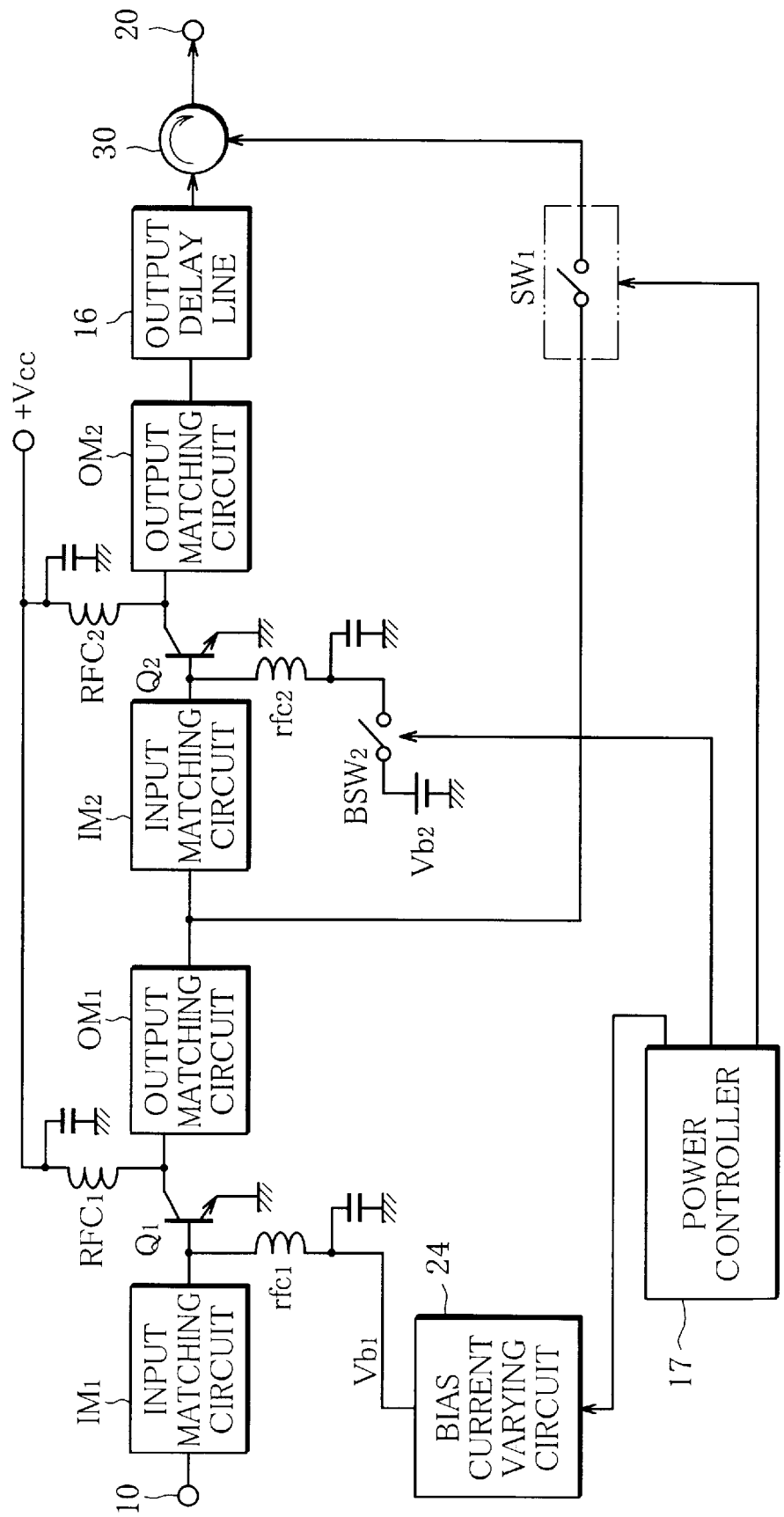
FIG. 3 is a schematic block diagram showing a high-frequency power amplifying apparatus according to a third embodiment of the present invention.
Figure 4:
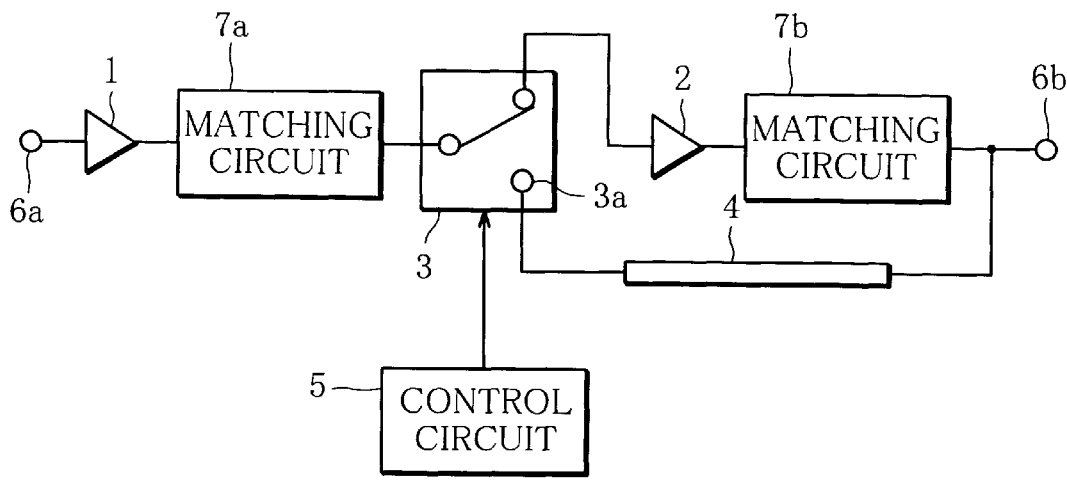
FIG. 4 is a schematic block diagram showing a conventional high-frequency power amplifying apparatus.
Figure 5:
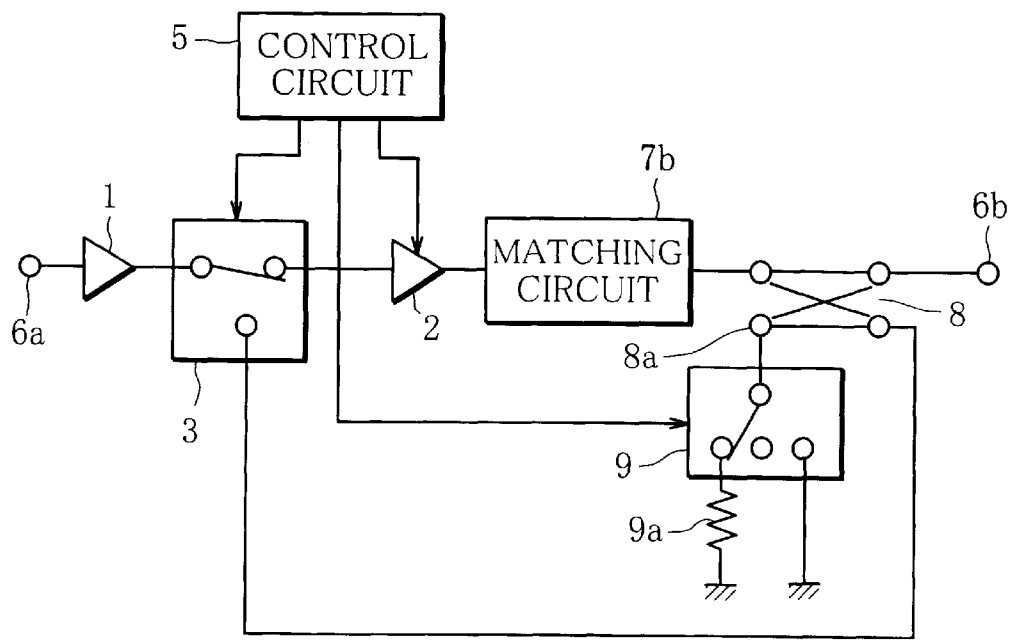
FIG. 5 is a schematic block diagram showing a conventional high-frequency power amplifying apparatus provided with a directional coupler.

In the following, a high-frequency power amplifying apparatus according to a third embodiment of the present invention will be explained with reference to FIG. 3.

Figure 2:
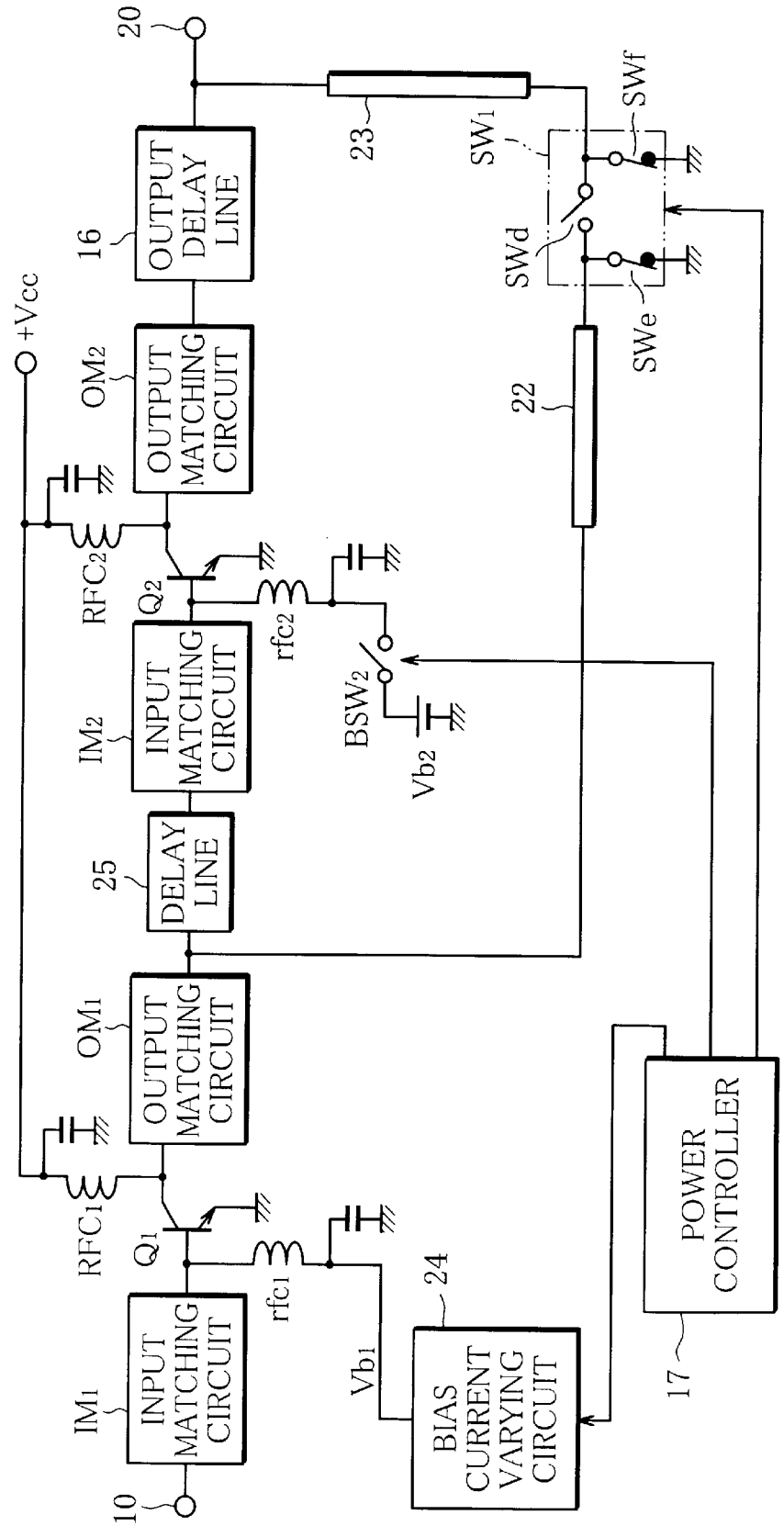
FIG. 2 is a schematic block diagram showing a high-frequency power amplifying apparatus according to a second embodiment of the present invention.

The power amplifying apparatus of this embodiment has the basic arrangement which is the same as that of the second embodiment shown in FIG. 2, but differs therefrom in that a three-terminal circulator 30 is provided instead of the first and second bypass delay lines 22, 23 shown in FIG. 2.

The circulator 30, which is interposed between the output delay line 16 and the output terminal 20 of the power amplifying apparatus, serves to protect the amplifying apparatus from reflected power caused by a failure of an antenna (not shown) serving as a load for the amplifying apparatus, and serves to stabilize the operation of the amplifying apparatus. The circulator 30 is provided with first, second and third terminals that are arranged in this order in the direction of signal circulation therein. The first terminal is connected through the switch circuit SW1 to the output side of the output matching circuit OM1, the second terminal is connected to the output side of the output delay line 16, and the third terminal is connected to the output terminal 20. The circulator 30 receives, at its first terminal, the output from the first-stage amplifier Q1, and receives, at its second terminal, the output of the second-stage amplifier Q2.

With this arrangement, the output of the second-stage amplifier Q2 is prevented from being introduced to the bypass circuit, so that the output power from the second-stage amplifier Q2 can be taken from the output terminal 20 through the circulator 30 with reliability. When the switch circuit SW1 is closed and the second-stage amplifier Q2 is in a cutoff state, the output of the first-stage amplifier Q1 can be taken from the output terminal 20 through the switch circuit SW1 and the circulator 30 without causing a loss, since the output delay line 16 is interposed between the second terminal of the circulator 30 and the second-stage amplifier Q2 and hence the impedance of the second-stage amplifier Q2 is high as viewed from the output terminal 20. Specifically, when the second-stage amplifier Q2 is in a cutoff state, the second-stage amplifier Q2 is open as viewed from the circulator 30, so that a high-frequency signal from the first-stage amplifier Q1 is completely reflected at the second terminal of the circulator 30 and is permitted to be fully transmitted to the output terminal 20. Thus, the output of the first-stage amplifier Q1 can be taken out without causing a loss, bypassing the second-stage amplifier Q2.

The present invention is not limited to the foregoing embodiments. For instance, the arrangements shown in FIGS. 1 to 3 can be, of course, appropriately combined with one another in constructing a high-frequency power amplifying apparatus. The number and construction of amplifiers may be determined depending on the requirements of the power amplifying apparatus. The present invention may be modified variously without departing from the technical concept thereof.

What is claimed is:

1. A high-frequency power amplifying apparatus, comprising:
    a plurality of amplifiers including at least first- and final-stage amplifiers and connected in series with one another in increasing order of saturation power;
    an input terminal connected to said first-stage amplifier;
    an output terminal connected to said final-stage amplifier;
    a power controller for selectively supplying said output terminal with an output from a desired one of the plurality of amplifiers in accordance with an externally demanded output power and for causing one or more amplifiers downstream of the desired one amplifier to be in a cutoff state when the desired one amplifier is not the final-stage amplifier; and
    an output delay line connected between said output terminal and said final-stage amplifier and having a line length thereof providing the final-stage amplifier with a high impedance as viewed from said output terminal when the final-stage amplifier is in a cutoff state.

2. The high-frequency power amplifying apparatus according to claim 1, further comprising:
    one or more switch circuits each interposed between said output terminal of the power amplifying apparatus and corresponding two adjacent amplifiers among the plurality of amplifiers,
    wherein said power controller closes a desired one of the one or more switch circuits in accordance with the demanded output power.

3. The high-frequency power amplifying apparatus according to claim 1, further comprising:
    one or more bias switches individually interposed between bias voltage sources and the plurality of amplifiers other than the first-stage amplifier,
    wherein said power controller opens at least one bias switch corresponding to one or more amplifiers disposed downstream of the desired one amplifier when the desired one amplifier is not the final-stage amplifier.

4. The high-frequency power amplifying apparatus according to claim 1, wherein the line length of said output delay line is set to a length that provides the final-stage amplifier with a high pure resistance as viewed from said output terminal of the power amplifying apparatus when the final-stage amplifier is in a cutoff state.

5. The high-frequency power amplifying apparatus according to claim 2, wherein each of said one or more switch circuits has a first on-off contact whose one side is connected between two amplifiers associated therewith, a second on-off contact interposed between another side of said first on-off contact and said output terminal of the power amplifying apparatus, and a third on-off contact whose one side is connected between said first and second on-off contacts and another side thereof is grounded, and
    said third on-off contact is closed when the first and second on-off contacts are open and is opened when the first and second on-off contacts are closed, under control of said power controller.

6. The high-frequency power amplifying apparatus according to claim 2, further comprising:
    a plurality of output matching circuits that are connected individually to output sides of the plurality of amplifiers and serve to increase output impedances of the plurality of amplifiers.

7. The high-frequency power amplifying apparatus according to claim 1, further comprising:
    an impedance conversion circuit connected between said one or more switch circuits, said output delay line and said output terminal of the power amplifying apparatus, and serves to match the output from each of the plurality of amplifiers to an output-terminal impedance of the power amplifying apparatus.

8. The high-frequency power amplifying apparatus according to claim 2, further comprising:
    one or more first bypass delay lines each of which is ¼ wavelength long and is interposed between a corresponding one of the plurality of amplifiers and the switch circuit associated therewith.

9. The high-frequency power amplifying apparatus according to claim 8, wherein each of the one or more switch circuits has a first on-off contact interposed between the amplifier associated therewith and said output terminal of the power amplifying apparatus, a second on-off contact interposed between the associated amplifier and a grounding, and said second on-off contact is closed when said first on-off contact is open and is opened when the first on-off contact is closed, under control of said power controller.

10. The high-frequency power amplifying apparatus according to claim 8, further comprising:

a second bypass delay line which is interposed between said output terminal of the power amplifying apparatus and said one or more switch circuits and which is ¼ wavelength long.

11. The high-frequency power amplifying apparatus according to claim 10, wherein each of the one or more switch circuits has a first on-off contact interposed between said first and second bypass delay lines, a second on-off contact interposed between a grounding and a connection between said first bypass delay line and said first on-off contact, and a third on-off contact interposed between a grounding and a connection between the first on-off contact and the second bypass delay line, and said second and third on-off contacts are closed when the first on-off contact is open and are opened when the first on-off contact is closed under control of said power controller.

12. The high-frequency power amplifying apparatus according to claim 1, further comprising:

a plurality of input matching circuits each connected to an input side of a corresponding one of the plurality of amplifiers, wherein each input matching circuit performs impedance-matching of a high-frequency signal, supplied from said input terminal of the power amplifying apparatus or the amplifier immediately upstream of the input matching circuit, to the amplifier immediately downstream of the input matching circuit.

13. The high-frequency power amplifying apparatus according to claim 12, further comprising:

a plurality of input delay lines, wherein each input delay line is interposed between the input matching circuit associated therewith and the amplifier immediately upstream of the input matching circuit, and serves to increase the impedance of a downstream amplifier as viewed from an upstream amplifier when the switch circuit connected at its one side between the upstream amplifier and the downstream amplifier is open, said upstream amplifier being disposed immediately upstream of the input delay line and said downstream amplifier being disposed immediately downstream of the upstream amplifier.

14. The high-frequency power amplifying apparatus according to claim 1, further comprising:

a circulator interposed between said output delay line and said output terminal of the power amplifying apparatus, wherein the plurality of amplifiers are constituted by said first- and final-stage amplifiers, and said circulator has a first terminal for receiving an output of the first-stage amplifier through the switch circuit associated therewith, a second terminal for receiving an output of the final-stage amplifier through said output delay line, and a third terminal connected to said output terminal of the power amplifying apparatus, said circulator being configured to transmit a signal received at said first terminal to said second terminal and then transmit the same to said third terminal, and transmit a signal received at said second terminal to said third terminal, thereby supplying the output from said first-stage or final-stage amplifier to said output terminal of the power amplifying apparatus.

* * * * *